United States Patent
Du et al.

(10) Patent No.: US 8,435,803 B2
(45) Date of Patent: May 7, 2013

(54) METHOD FOR DEPOSITING MICROCRYSTALLINE SILICON AND MONITOR DEVICE OF PLASMA ENHANCED DEPOSITION

(75) Inventors: Chen-Chung Du, Hsinchu (TW); Sheng-Lang Lee, Hsinchu County (TW); Muh-Wang Liang, Miaoli County (TW); Jen-Rong Huang, Hsinchu (TW); Chia-Hao Chang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 501 days.

(21) Appl. No.: 12/758,698

(22) Filed: Apr. 12, 2010

(65) Prior Publication Data
US 2011/0136269 A1    Jun. 9, 2011

(30) Foreign Application Priority Data
Dec. 8, 2009   (TW) ................. 98141847 A

(51) Int. Cl.
*H01L 21/00* (2006.01)

(52) U.S. Cl.
USPC ................. 438/7; 118/723; 427/569

(58) Field of Classification Search ...... 438/7; 118/723; 427/569
See application file for complete search history.

(56) References Cited

U.S. PATENT DOCUMENTS

| | | | | |
|---|---|---|---|---|
| 8,309,446 | B2 * | 11/2012 | Weidman et al. | 438/558 |
| 2005/0164474 | A1 * | 7/2005 | Guha et al. | 438/478 |
| 2005/0202653 | A1 * | 9/2005 | Joshi et al. | 438/479 |
| 2006/0166467 | A1 * | 7/2006 | Witvrouw et al. | 438/478 |
| 2006/0240649 | A1 * | 10/2006 | Roschek et al. | 438/513 |
| 2007/0259130 | A1 * | 11/2007 | Von Kaenel et al. | 427/569 |
| 2008/0245414 | A1 * | 10/2008 | Sheng et al. | 136/261 |
| 2009/0029532 | A1 * | 1/2009 | Huang et al. | 438/479 |
| 2009/0050058 | A1 * | 2/2009 | Ovshinsky | 118/723 MW |
| 2009/0090616 | A1 * | 4/2009 | Du et al. | 204/192.13 |
| 2009/0200552 | A1 * | 8/2009 | Won et al. | 257/57 |
| 2010/0003780 | A1 * | 1/2010 | Choi et al. | 438/97 |
| 2010/0258169 | A1 * | 10/2010 | Sheng et al. | 136/255 |
| 2011/0061733 | A1 * | 3/2011 | Hurley et al. | 136/258 |

FOREIGN PATENT DOCUMENTS

| | | |
|---|---|---|
| EP | 1505174 A1 | 2/2005 |
| JP | 2005183620 A | 7/2005 |

OTHER PUBLICATIONS

P. Torres et al., "Deposition of Thin-Film Silicon for Photovoltaics: Use of VHF-GD and OES," Progress in Plasma Processing of Materials—5th European Conference on Thermal Plasma Processes, 1998, pp. 855-860, Infoscience, Europe.
M.N. van den Donker et al., "Microcrystalline Silicon Deposition: Process Stability and Process Control," Thin Solid Films, Jan. 2007, vol. 515, pp. 7455-7459, Elsevier, US.

* cited by examiner

*Primary Examiner* — David Vu
*Assistant Examiner* — Caleb Henry

(57) ABSTRACT

A method for depositing a microcrystalline silicon film is disclosed, including performing an open loop and close loop plasma enhanced deposition process without and with modulating process parameters, respectively. A film is deposited by the open loop plasma enhanced deposition process till a required film crystallinity and then performing a closed loop plasma enhanced deposition process which monitors species plasma spectrum intensities SiH* and Hα and modulates process parameters of the plasma enhanced deposition process resulting in the species concentration stabilization which controls the intensities variation of SiH* and Hα within an allowed range of a target value for improving film depositing rate.

11 Claims, 5 Drawing Sheets

METHOD FOR DEPOSITING MICROCRYSTALLINE SILICON AND MONITOR DEVICE OF PLASMA ENHANCED DEPOSITION

CROSS REFERENCE

This Application claims priority of Taiwan Patent Application No. 098141847, filed on Dec. 8, 2009, the entirety of which is incorporated by reference herein

BACKGROUND OF THE INVENTION

1. Field of the Invention

This invention generally relates to a thin film depositing technology and more particularly relates to a method for depositing microcrystalline silicon.

2. Description of the Related Art

A tandem silicon thin film solar cell generally uses microcrystalline silicon which has an advantage to increase photoelectric conversion efficiency of solar cells. The microcrystalline silicon is generally fabricated by plasma enhanced chemical vapor deposition (PECVD). However, the deposition rate of the microcrystalline silicon is low (about 2 Å/sec), thus becoming a bottleneck during application. Specifically, a thin film solar cell generally requires a microcrystalline silicon having thickness of about 1-2 μm, such that the depositing time often exceeds one hour. Such low deposition rate is more problematic for large area depositing processes because crystallinity uniformity is concerned. Therefore, the low throughput of depositing microcrystalline silicon resulting in the cost of generating electric power per watt is high. Accordingly, it is important to increase depositing rate under good crystallinity of microcrystalline silicon.

A conventional art, Japanese patent JP 20030421313, uses different duty time of pulse plasma in deposition time to increase depositing rate and crystallinity ratio of microcrystalline silicon. However, the multi-step process setting have made the process operation more complicated and difficult. Further, Japanese patent JP 20030421313 discloses an open loop process which cannot in-time modulate process condition according to monitored variation of species (e.g. SiHx and H) in a plasma. Therefore, the depositing rate of this art might be limited due to the excessive hydrogen etching effect while the hydrogen species continually increases during deposition process.

BRIEF SUMMARY OF INVENTION

The invention provides a method for depositing a microcrystalline silicon film, comprising performance of an open loop and a close loop plasma enhanced deposition process without and with modulating process parameters, respectively. A film is deposited by the open loop plasma enhanced deposition process till a film crystallinity is stable and then by the close loop plasma enhanced deposition process which monitors species plasma intensity SiH* and Hα and modulates the process parameters of the plasma enhanced deposition process resulting in the species concentration stabilization which the intensities variation of SiH* and Hα within an allowed variation range for improving film depositing rate.

The invention further provides a monitor apparatus for plasma enhanced deposition process, comprising a plasma enhanced deposition apparatus (e.g., PECVD), a species concentration analyzing apparatus connected to the plasma enhanced deposition apparatus, and a process modulation system connected to the species concentration analyzing apparatus and the plasma enhanced deposition apparatus.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
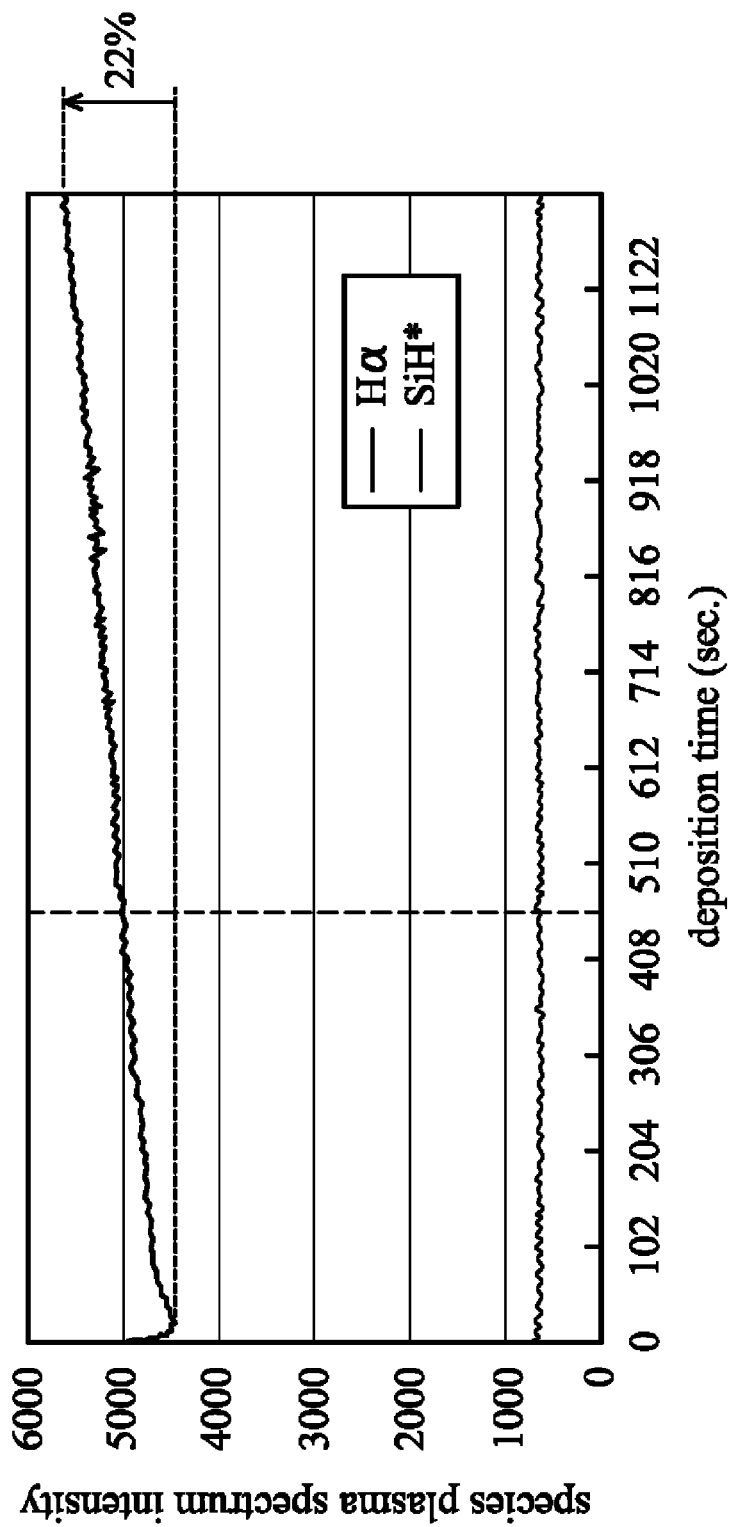
FIG. 1 shows a diagram with species plasma spectrum intensity as a function of the depositing time of a conventional PECVD process.

First, the growth mechanism of microcrystalline silicon is illustrated from a thin film engineering aspect. Growth mechanism of a microcrystalline silicon film comprises several stages as follows: species $SiH_x$ absorbing onto a substrate, diffusing to cluster for nucleation, nuclear growth, forming continuous film and growth of film. The species H provides hydrogen etching effect on the film to get the required crystallinity. During an open loop process of depositing microcrystalline silicon in PECVD, a process gas is dissociated in the plasma field to form species $SiH_x$ and H, wherein $SiH_x$ is a source of thin film growth and H has function of hydrogen etching to achieve the required crystallinity. However, if the amount of species H increased up exceedingly, $SiH_x$ would be diluted and growth rate of microcrystalline silicon thin film is reduced. FIG. 1 shows plasma spectrum intensity as a function of depositing time of SiH* (i.e. species $SiH_x$ concentration) and Hα (i.e. species H concentration) in a plasma intensity of an open loop process. Referring to FIG. 1, during depositing microcrystalline silicon using conventional open loop PECVD process, Hα increases at least 22% but SiH* is relatively stable during whole deposition time. As well, the greatly increased Hα would lead to excessive hydrogen etching effect resulting in reducing depositing rate of microcrystalline silicon.

Figure 2:
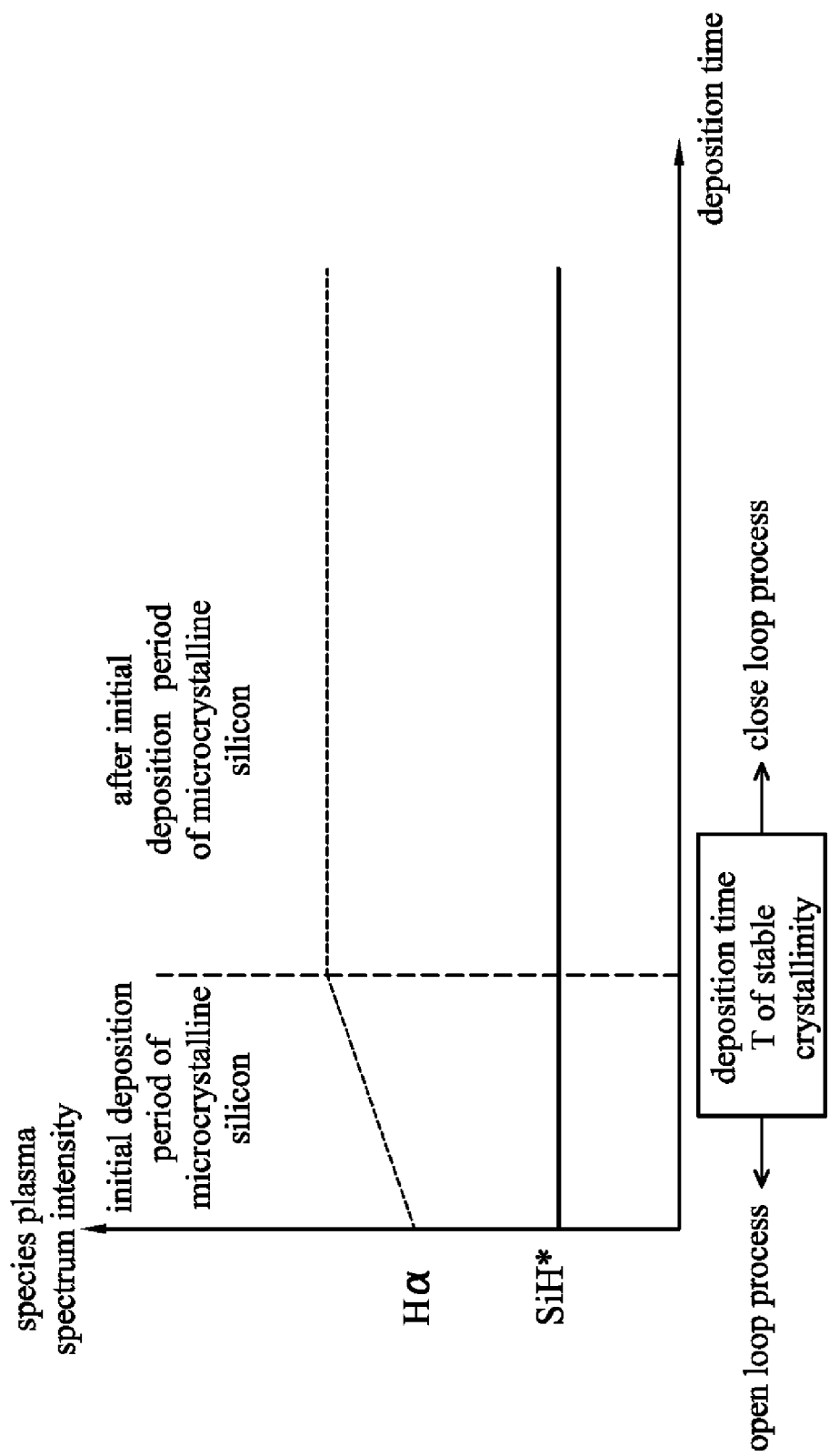
FIG. 2 shows a diagram with species plasma spectrum intensity as a function of depositing time of the process for depositing microcrystalline silicon film of an embodiment of the invention.

Referring to FIG. 2, a deposition microcrystalline silicon process with higher depositing rate of an embodiment of the invention is provided. A microcrystalline silicon film is deposited using open loop process without real time modulating process parameters in an initial period of a deposition process (i.e. before the depositing time T of stable crystallinity) to get a microcrystalline silicon film having the required crystallinity. After the initial period of deposition process (i.e. after the depositing time T of stable crystallinity), the microcrystalline silicon is deposited using close loop process with process parameters modulated by plasma monitoring apparatus, wherein the species plasma intensities are controlled to be maintained at the condition of the deposition time T and keeping stable. As well, the species concentration of SiHx and H is kept at a same level after the deposition time T. Therefore, the invention can eliminate the excessive species H in conventional PECVD process which adversely affects microcrystalline silicon growth during deposition time, further, increases the depositing rate of microcrystalline silicon.

Figure 3:
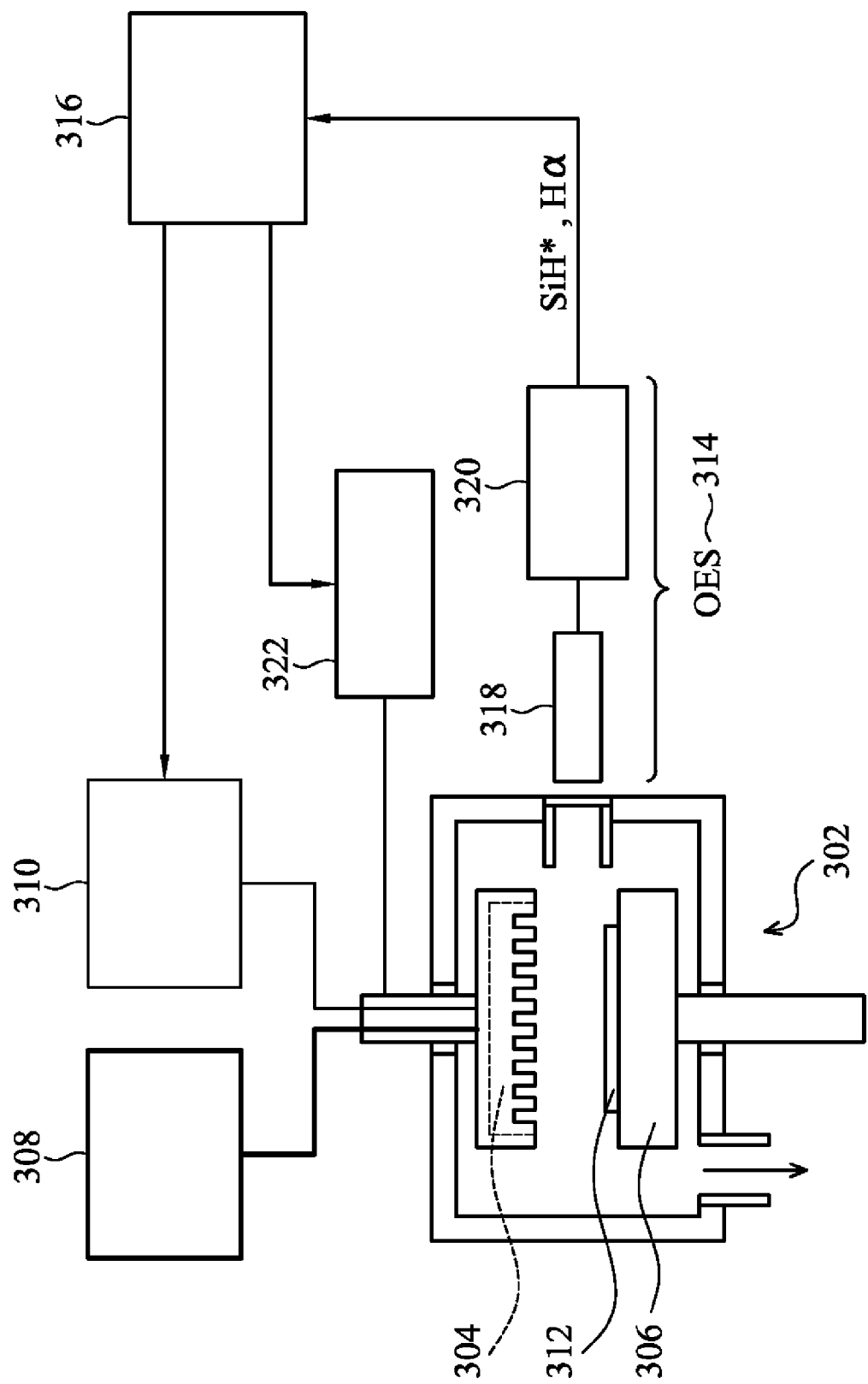
FIG. 3 shows a diagram of an embodiment of monitor apparatus for depositing microcrystalline silicon film.

FIG. 3 shows a diagram of a thin film deposition PECVD apparatus with a process modification system. Referring to FIG. 3, an embodiment of the invention provides a plasma enhanced thin film depositing apparatus, such as very high frequency plasma enhanced chemical vapor deposition (VHF PECVD), comprising a vacuum process chamber 302, a upper electrode 304 connected to a high frequency pulse power source, a lower electrode 306 (also referred to as a heater for heating a substrate), and a pair of process gas lines (for example comprising $H_2$ and $SiH_4$ gas line). Each gas line comprises a mass flow controller (MFC) for controlling flow of process gas. For example, a first MFC 308 controls the flow of hydrogen ($H_2$), and a second MFC 310 controls the flow of silane ($SiH_4$). The thin film deposition apparatus is applied with a high frequency pulse power to generate plasma dissociating hydrogen and silane to species of H and SiHx for depositing microcrystalline silicon on a substrate 312. Residue gas during the deposition reaction is pump out by a vacuum system.

In addition, the embodiment further comprises a species concentration analyzing apparatus which includes an optical emission spectroscopy (OES) 314 and a computer based process modulation system 316. The optical emission spectroscopy 314 comprises a plasma light detective head 318 and a plasma spectrum meter 320. The OES 314 is used to detect species plasma spectrum intensities of SiH* at wavelength 414 nm and Hα at wavelength 656 nm, respectively. The computer based process modulation system 316 picks the species spectrum intensity of SiH* and Hα to modulate the silane gas flow through MFC 310 and the power through power generating apparatus 322 for keeping the plasma condition stable. That is, species concentration ratio of SiH* and Hα in plasma in kept stable.

Figure 4:
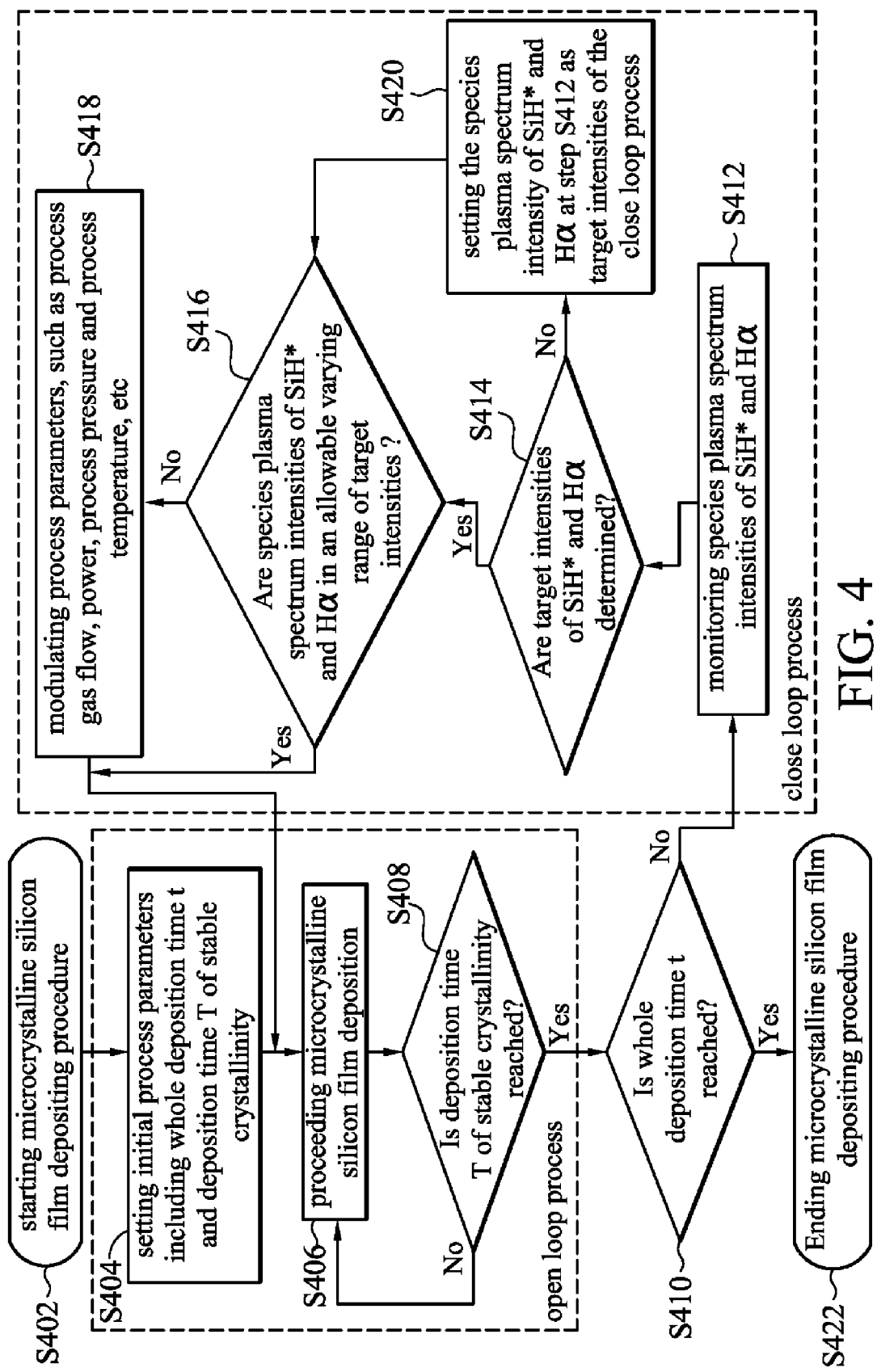
FIG. 4 shows a flow chart illustrating depositing a microcrystalline silicon film of an embodiment of the invention.
Figure 5:
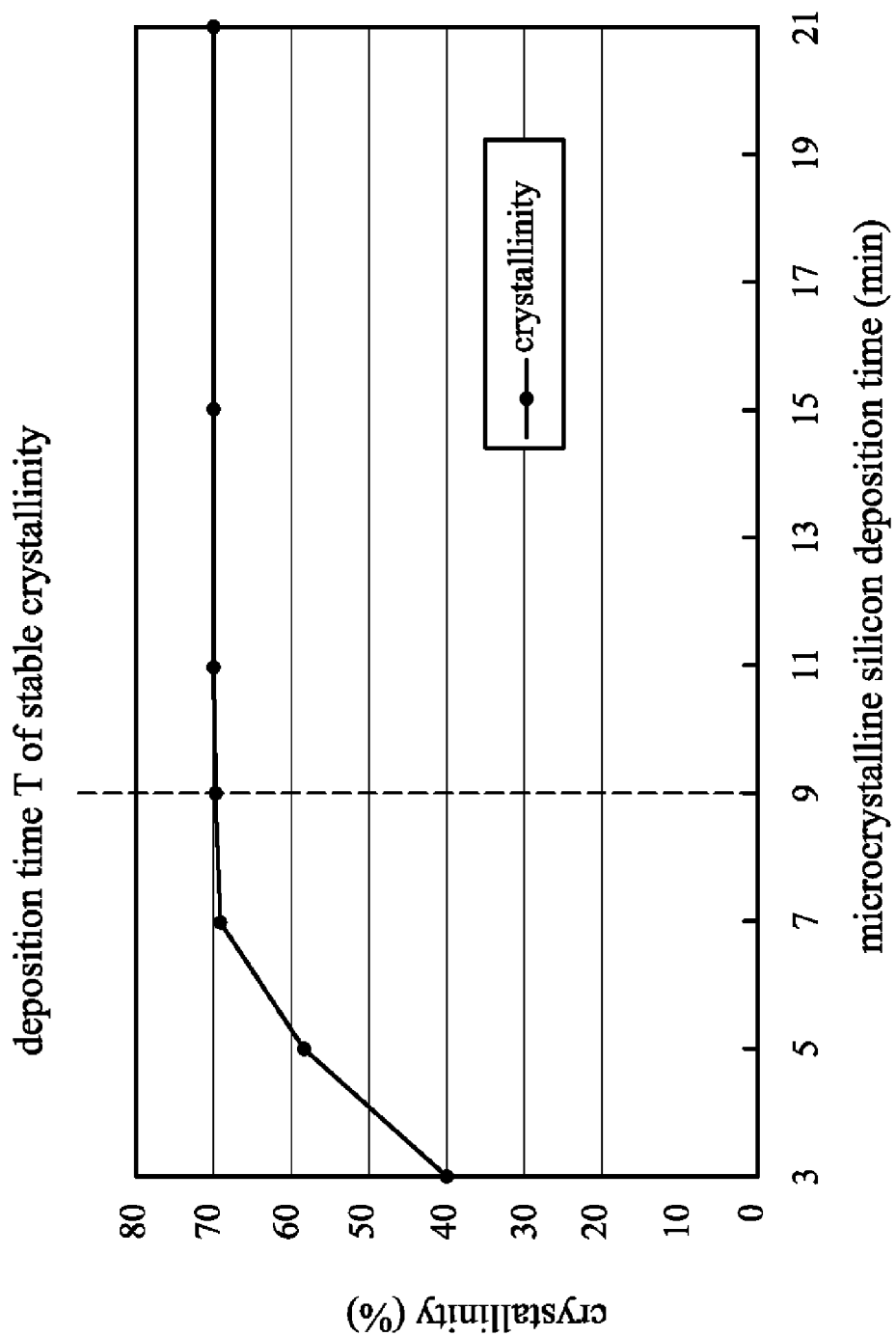
FIG. 5 shows a diagram with the crystallinity as a function of depositing time.

A method for depositing a microcrystalline silicon film of an embodiment of the invention is illustrated in accordance with FIG. 4. First, a microcrystalline silicon film depositing procedure starts at step S402. Next, the duration required for whole deposition time t, the depositing time T of stable crystallinity and initial process condition are set in step S404. The method to get the required depositing time T of stable crystallinity as an initial period of microcrystalline silicon film deposition is illustrated in accordance with FIG. 5 which shows a curve with crystallinity as a function of deposition time. The film crystallinity is measured on several different deposition time with same process parameters in an open loop process. FIG. 5 shows the deposition time T required for stable crystallinity of microcrystalline silicon film. The duration before the depositing time T of stable crystallinity is called an initial deposition period of microcrystalline silicon film, and the duration after the depositing time T of stable crystallinity is called the after initial deposition period of microcrystalline silicon film. After parameters setting step, a microcrystalline silicon film is deposited in step S406. Step S408 checks whether the crystallinity depositing time T is reached or not. Depositing microcrystalline silicon film using an open loop process (i.e. without modulating process parameters) in step S406 is done till the depositing time T of stable crystallinity is reached. When the depositing time T of stable crystallinity is reached, the step S410 is performed to check whether the whole deposition time t is reached or not. If the whole deposition time t is not reached, step S412 begins a close loop process to real-time modulate process parameters by monitoring SiH* and Hα plasma intensity. The step S414 is performed to check whether the target intensity is determined or not. When the close loop process is first performed, step S420 is performed to use the species plasma spectrum intensities of SiH* and Hα omeasured in step S412 as target intensities. Step S416 is performed to check whether the species plasma spectrum intensities of SiH* and Hα measured in step S412 are in an allowable varying range of the target intensities. For example, the allowable varying range can be ±1%, but the invention is not limited thereto. The allowable varying range can be changed according to process requirements. If the species plasma spectrum intensities of SiH* and Hα are monitored to be in the allowable varying range of the target intensities, the invention continues depositing microcrystalline silicon film (S406) wherein process parameters are not required to be changed. If the species plasma spectrum intensities of SiH* and Hα are not in an allowable varying range of the target intensities, the invention performs step S418 to real-time modulate process parameters (e.g. process gas flow, power, pressure and temperature) and the S406 is then performed to deposit the microcrystalline silicon film using the new process condition. The close loop process perform the microcrystalline silicon film deposition repeatedly till the whole depositing time t is reached. That is, the whole deposition process is stop at S422. It is noted that microcrystalline silicon is deposited using open loop process without modulating process parameters in the initial period of the deposition to get a good crystallinity microcrystalline silicon film. After the initial period of the deposition, the microcrystalline silicon is deposited using close loop process with process parameters modulated by a plasma intensity monitoring apparatus. Specifically, the species plasma spectrum intensities of SiH* and Hα at the deposition time T of stable crystallinity are set as target intensities and used to modulate the process. The plasma intensities both at after the initial deposition period of microcrystalline silicon film and at the deposition time T of stable crystallinity are control in similar level (that is, the species plasma spectrum intensities of SiH* and Hα are maintained in close loop process). Therefore, the invention can eliminate the generation of excess species H during the whole deposition time, which affects microcrystalline silicon film growth in deposition. That is, the species H is controlled to increase the depositing rate of microcrystalline silicon.

In addition to using OES to monitor microcrystalline silicon depositing process, the invention can also use residual gas analyzer (RGA) or integrate OES and RGA to monitor species concentration variation to eliminate excess amounts of Hα.

According to the description above, the invention can improve the complicated process which presets the multilevel process condition for depositing a microcrystalline silicon film of the conventional technology. In addition, the invention can further provide stable plasma field for a long duration after the initial deposition period of a microcrystalline silicon film to eliminate over etching effects caused by excess species H concentration. Therefore, the invention can not only increase depositing rate of microcrystalline silicon but also maintain good film crystallinity. Accordingly, the method of the invention can be applied to mass production of high efficiency silicon thin film solar cells.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for depositing a microcrystalline silicon film, comprising:

performing an open loop plasma enhanced deposition process without modulating process parameters; and after a required film crystallinity is obtained by the open loop plasma enhanced deposition process, performing a close loop plasma enhanced deposition process, comprising:

monitoring species plasma spectrum intensities of SiH* and Hα; and modulating process parameters to limit the species plasma spectrum intensities of SiH* and Hα within an allowable varying range of a target intensity.

2. The method for depositing a microcrystalline silicon film as claimed in claim 1, wherein the required film crystallinity is determined according to a depositing time T of stable crystallinity, which is determined by a method comprising:

measuring the film crystallinity on different deposition time in the open loop plasma enhanced deposition process without modulating process parameters; and determining the depositing time T required for crystallinity of the microcrystalline silicon film to be stable.

3. The method for depositing a microcrystalline silicon film as claimed in claim 2, wherein the closed loop plasma enhanced deposition process is performed after the depositing time T of stable crystallinity of the microcrystalline silicon film.

4. The method for depositing a microcrystalline silicon film as claimed in claim 1, wherein the process parameters comprises hydrogen gas flow, silane gas flow, power, process pressure, process temperature, or combinations thereof.

5. The method for depositing a microcrystalline silicon film as claimed in claim 2, wherein the target intensity is the species plasma spectrum intensities of SiH* and Hα at the depositing time T of stable crystallinity.

6. The method for depositing a microcrystalline silicon film as claimed in claim 5, wherein the allowable varying range is ±1% of the target intensities of the SiH* and Hα at the depositing time T of stable crystallinity.

7. The method for depositing a microcrystalline silicon film as claimed in claim 1, wherein the step of monitoring species plasma spectrum intensities of SiH* and Hα comprises measuring species plasma spectrum intensities of the species SiH* and Hα using an optical emission spectrometer (OES).

8. The method for depositing a microcrystalline silicon film as claimed in claim 1, wherein the step of monitoring species plasma spectrum intensities SiH* and Hα uses a residual gas analyzer (RGA).

9. The method for depositing a microcrystalline silicon film as claimed in claim 1, wherein the step of monitoring species plasma spectrum intensities SiH* and Hα uses an optical emission spectrometer (OES) and a residual gas analyzer (RGA).

10. The method for depositing a microcrystalline silicon film as claimed in claim 1, wherein the method is applied to fabricate a microcrystalline silicon film of a silicon thin film solar cell.

11. The method for depositing a microcrystalline silicon film as claimed in claim 1, wherein the method enhances the depositing rate of the microcrystalline silicon film.

* * * * *